United States Patent
Convent et al.

(10) Patent No.: US 11,860,296 B2
(45) Date of Patent: Jan. 2, 2024

(54) RADAR ARRANGEMENT

(71) Applicant: KROHNE Messtechnik GmbH, Duisburg (DE)

(72) Inventors: Thomas Convent, Issum (DE); Christoph Dahl, Bochum (DE); Michael Gerding, Bochum (DE); Christian Schulz, Bochum (DE); Michael Vogt, Bochum (DE)

(*) Notice: Subject to any disclaimer, the term of this patent is extended or adjusted under 35 U.S.C. 154(b) by 281 days.

(21) Appl. No.: 17/160,903

(22) Filed: Jan. 28, 2021

(65) Prior Publication Data
US 2021/0231772 A1 Jul. 29, 2021

(30) Foreign Application Priority Data
Jan. 28, 2020 (DE) .................. 10 2020 102 037.6

(51) Int. Cl.
*G01S 7/03* (2006.01)
*H01Q 3/34* (2006.01)
*H01Q 9/04* (2006.01)

(52) U.S. Cl.
CPC .............. *G01S 7/032* (2013.01); *H01Q 3/34* (2013.01); *H01Q 9/0457* (2013.01)

(58) Field of Classification Search
CPC ............. H01L 23/66; H01L 2223/6677; H01L 2223/6627; H01Q 1/2283; H01Q 1/38; H01Q 3/34; H01Q 9/0457; G01S 7/032
USPC .............. 343/700 MS; 29/600; 333/135, 238
See application file for complete search history.

(56) References Cited

U.S. PATENT DOCUMENTS

| | | | | |
|---|---|---|---|---|
| 5,400,039 A | * | 3/1995 | Araki | .................. H04B 1/3822 343/846 |
| 5,525,834 A | * | 6/1996 | Fischer | .................. H01L 23/50 257/E23.079 |
| 5,628,053 A | * | 5/1997 | Araki | ...................... H01Q 1/32 455/73 |

(Continued)

FOREIGN PATENT DOCUMENTS

| | | |
|---|---|---|
| DE | 10063437 A1 | 7/2002 |
| DE | 102008042449 A1 | 4/2010 |

OTHER PUBLICATIONS

European Search Report; Application No. EP 21 15 3259; dated May 19, 2021; 2 Pages.

*Primary Examiner* — Vladimir Magloire
*Assistant Examiner* — Michael W Justice
(74) *Attorney, Agent, or Firm* — Patrick D. Duplessis

(57) ABSTRACT

A radar arrangement includes a printed circuit board (PCB), an electronic component, and an antenna. The electronic component is arranged on the PCB and is used to generate a high-frequency signal. The PCB has at least four electrically conductive layers separated from one another by at least three electrically insulating layers. A first conductive inner layer is adjacent to a first conductive outer layer, and a second conductive inner layer is adjacent to a second conductive outer layer. The electronic component is arranged on the first conductive outer layer. The antenna is formed at least partially in the second outer layer. The signal generated by the electronic component is transmitted to the antenna, which is formed at least partially in the second conductive outer layer of the PCB, through a region of the conductive inner layers and insulating inner layers of the PCB.

24 Claims, 6 Drawing Sheets

(56) References Cited

U.S. PATENT DOCUMENTS

| | | | | |
|---|---|---|---|---|
| 5,701,032 | A * | 12/1997 | Fischer | H01L 23/49811 257/E23.079 |
| 5,785,789 | A * | 7/1998 | Gagnon | B32B 15/14 156/230 |
| 7,230,187 | B2 * | 6/2007 | Xu | H05K 1/0265 361/312 |
| 8,966,749 | B2 * | 3/2015 | Kim | H01L 21/6835 29/841 |
| 9,270,030 | B2 * | 2/2016 | Alexopoulos | H01Q 15/006 |
| 10,056,922 | B1 * | 8/2018 | Tsvelykh | H01P 1/20 |
| 11,428,713 | B2 * | 8/2022 | Hong | H01Q 9/045 |
| 2004/0113840 | A1 | 6/2004 | Gottwald et al. | |
| 2005/0135072 | A1 * | 6/2005 | Xu | H05K 1/0265 174/257 |
| 2010/0101081 | A1 * | 4/2010 | Kim | H01L 24/85 29/832 |
| 2010/0103027 | A1 | 4/2010 | Klar et al. | |
| 2011/0250838 | A1 * | 10/2011 | Alexopoulos | H01Q 19/10 343/837 |
| 2012/0212384 | A1 * | 8/2012 | Kam | H01Q 1/2283 343/834 |
| 2012/0280856 | A1 * | 11/2012 | Oswald | G01S 7/032 342/174 |
| 2013/0126622 | A1 * | 5/2013 | Finn | H05K 3/103 29/601 |
| 2014/0266508 | A1 * | 9/2014 | Song | H05K 1/162 361/301.2 |
| 2015/0178615 | A1 * | 6/2015 | Finn | H01Q 7/00 29/601 |
| 2015/0325908 | A1 | 11/2015 | Reuter | |
| 2019/0198466 | A1 | 6/2019 | Chen et al. | |
| 2019/0213860 | A1 * | 7/2019 | Shaprio | H04W 4/029 |
| 2020/0118949 | A1 * | 4/2020 | Moallem | H01L 25/16 |
| 2020/0319230 | A1 * | 10/2020 | Hong | H05K 3/22 |
| 2020/0340292 | A1 * | 10/2020 | Ettridge | E06B 3/66328 |

* cited by examiner

RADAR ARRANGEMENT

TECHNICAL FIELD

The invention relates to a radar arrangement having a printed circuit board, at least one electronic component and at least one antenna, wherein the electronic component is arranged on the printed circuit board and is used at least to generate a high-frequency signal, having at least one line structure, being part of the printed circuit board, for guiding the high-frequency signal from the electronic component into the region of the antenna, wherein the line structure radiates the high-frequency signal at an open-ended radiation region and impinges the antenna with the radiated high-frequency signal.

BACKGROUND

The aforementioned radar arrangements have been known for a long time in the state of the art from very different fields of application, for example from level measurement technology or also from the automotive field. Radar arrangements of the type described often not only have a single antenna and a single electronic component for generating a high-frequency signal, but can also have several antennas and electronic components for generating different—for example phase-shifted—high-frequency signals. In this way, antenna arrays can be implemented, wherein phase-shifted high-frequency signals, for example, are generated electronically by means of appropriate activation, and a directional effect can thus be achieved (patch antenna arrays, panel antennas).

In the prior art, it is known that the antenna and the line structure are arranged on the side of the printed circuit board on which the electronic component for generating the high-frequency signal is also arranged. The advantage of this arrangement is a relatively simple high-frequency design on only one printed circuit board level and the implementation of simple antenna structures. Disadvantages arise here with regard to the process separation required in part, since the electronics are arranged on the antenna side and thus also on the side of the printed circuit board facing the process to be monitored. Problems may also arise with regard to explosion protection requirements.

SUMMARY

It is therefore the object of the present invention to provide a radar arrangement in which the disadvantages shown from the prior art are at least partially avoided.

In the radar arrangement described at the beginning, the derived object is initially and essentially achieved in that the printed circuit board has at least four electrically conductive layers which run essentially parallel to one another and are separated from one another by at least three electrically insulating layers, so that two electrically conductive outer layers of the printed circuit board, the first electrically conductive outer layer and the second electrically conductive outer layer, are formed by two electrically conductive layers of the at least four electrically conductive layers and the remaining at least two electrically conductive layers form electrically conductive inner layers of the printed circuit board, wherein the first electrically conductive inner layer is adjacent to the first electrically conductive out-er layer and the second electrically conductive inner layer is adjacent to the second electrically conductive outer layer, and in that the at least three electrically insulating layers all form electrically insulating inner layers of the printed circuit board. As a result, viewed in the direction of the surface normals of the layers of the printed circuit board running parallel to one another, the following structure results: first electrically conductive outer layer, electrically insulating inner layer, first electrically conductive inner layer, further electrically insulating inner layer, second electrically conductive inner layer, further electrically insulating inner layer and second electrically conductive outer layer. If further electrically conductive layers are implemented, however, the structure remains such that the first and the second electrically conductive layers form electrically conductive outer layers of the printed circuit board and all electrically insulating layers form electrically insulating inner layers; there is thus always one electrically insulating layer less than there are electrically conductive layers.

Furthermore, the radar arrangement according to the invention is characterized in that the electronic component is arranged on the first outer layer of the printed circuit board, which accordingly forms the component side of the printed circuit board. Furthermore, according to the invention, the antenna is formed at least partially in the second electrically conductive outer layer of the printed circuit board, i.e. usually as a so-called patch, the dimensions of which depend on the wavelength of the high-frequency signal to be radiated. Overall, in the radar arrangement according to the invention, the high-frequency signal generated by the electronic component is transmitted to the antenna formed at least partially in the second outer layer of the printed circuit board through the region of the electrically conductive and electrically insulating inner layer of the printed circuit board. The high-frequency signal is then ultimately radiated into the external space via the antenna.

The design described has the advantage that a strict separation is achieved between the process side, i.e. the side on which the antenna is implemented, and the assembly side, i.e. the side on which the electronic component is arranged—or even several electronic components are arranged. This separation makes it possible to implement particularly compact designs, especially also when the radar arrangement has several antennas and several electronic components.

When the printed circuit board design refers to various electrically conductive layers, this obviously does not mean that the electrically conductive layers are continuously conductive, i.e. form continuous metal layers, because a radar arrangement could obviously not be implemented with this concept. The professional understanding is that structures can also be formed within the electrically conductive layers that are electrically non-conductive, for example in that metallization is not carried out in the relevant areas or in that the conductive layer is removed. This is the usual and expert understanding of the meaningful implementation of multilayer printed circuit boards. Thus, different conductive structures can be arranged in the respective electrically conductive layers, which are electrically insulated from each other.

In a preferred design of the radar arrangement, it is provided that the electrically insulating layers have a thickness of 50 μm to 200 μm, in particular a layer thickness of between 90 μm and 110 μm. Preferably, it is further provided that the electrically insulating layers comprise a high-frequency substrate that has a low attenuation for electromagnetic waves at frequencies of the high-frequency signal. This ensures that the high-frequency signals radiated by the radiation region of the line structure can be transmitted as unattenuated as possible through the printed circuit board, which of course presumes that the electrically conductive layers have recesses in the corresponding region, i.e. in which the electrically conductive layer is not formed.

According to a further advantageous design, it is provided that the electrically conductive inner layers have a layer thickness of 10 μm to 30 μm, in particular a layer thickness of 15 μm to 21 μm, wherein the electrically conductive inner layers are preferably formed from copper. These layer thicknesses permit the formation of conductive structures within the electrically conductive inner layers that are sufficient for the present purposes.

It is particularly preferred that the electrically conductive outer layers have a layer thickness of 15 μm to 60 μm, in particular a layer thickness of 40 μm to 55 μm, wherein the electrically conductive outer layers are preferably also formed from copper. Preferably, the greater layer thickness of the electrically conductive outer layers compared with the layer thicknesses of the electrically conductive inner layers is achieved by initially forming all electrically conductive layers of the same thickness and then electroplating a further copper layer onto the electrically conductive outer layers. Electroplating is carried out, for example, as a result of the production of electrically conductive through-connections in the printed circuit board, wherein additional conductive material is electroplated onto the walls of through-holes in the printed circuit board, so that corresponding material thicknesses are then also deposited on the already existing electrically conductive outer layers and contribute to their thickening.

If the layer thicknesses specified above are used, the overall result is a printed circuit board structure that is flexible and not particularly stable mechanically, so that, for example, the assembly of electronic components on the assembly side, i.e. on the first electrically conductive outer layer, can also be problematic. For this reason, it is further provided in a preferred design that a stiffening layer is fixed to the second electrically conductive outer layer, in particular the stiffening layer is laminated or bonded to the second electrically conductive outer layer, wherein the stiffening layer preferably consists of a metallized non-metal or of a metal. The non-metal is preferably a composite material, preferably a composite material of glass fiber fabric and epoxy resin, for example FR-4. This gives the printed circuit board a mechanically stable structure, which both simplifies handling during manufacture—i.e., for example, also during assembly—of the printed circuit board, but which also enables the printed circuit board to be used in robust environments. Preferably, the metallization is provided on both sides of the stiffening layer, alternatively the metallization is provided only on the outer side of the stiffening layer, i.e. not on the connection side of the stiffening layer with the second electrically conductive outer layer.

In order to achieve sufficient stability of the printed circuit board as a whole, it is preferably provided that the stiffening layer has a thickness of 0.5 mm to 0.9 mm, in particular a thickness between 0.6 mm and 0.8 mm.

A further preferred design of the radar arrangement is characterized in that the stiffening layer has a recess in the region of the antenna formed at least partially in the second conductive outer layer, in particular wherein the boundary edge of the recess is metallized. As a result, the radiation characteristic of the antenna is influenced to a certain extent, for example a better directivity can be achieved than without the proposed design of the stiffening layer.

A further preferred design of the radar arrangement is characterized in that, in three of the electrically conductive layers, the radiation region of the line structure for guiding the high-frequency signal, a fine aperture for defined passage of the electromagnetic radiation radiated by the radiation region of the line structure, and the antenna in the second electrically conductive outer layer are implemented in the direction of the surface normals of the electrically conductive layers seen from the first electrically conductive outer layer to the second electrically conductive outer layer. Altogether, an aperture-coupled patch antenna is thus implemented. The electromagnetic waves radiated from the radiation region of the line structure pass through the fine aperture, which is nothing more than a preferably slot-shaped opening within the respective electrically conductive layer, to the antenna in the second electrically conductive outer layer, which then radiates an electromagnetic wave into the free space in accordance with the excitations. The radiation region of the line structure, the fine aperture, and the antenna in the second electrically conductive outer layer may be geometrically matched to each other to meet specific polarization, bandwidth, and radiation pattern requirements, but this is not within the scope of the present invention in detail.

A preferred design of the aperture-coupled antenna described above is that the radiation region of the line structure for guiding the high-frequency signal is implemented in the first electrically conductive outer layer, the fine aperture is implemented in the first electrically conductive inner layer, a coarse aperture is implemented in the second electrically conductive inner layer, wherein the coarse aperture is larger than the fine aperture and is used for the unhindered passage of the electromagnetic radiation passing through the fine aperture to the antenna formed at least partially in the second electrically conductive outer layer. The coarse aperture is formed to be significantly larger than the fine aperture and, compared to the fine aperture, simply represents a large-area passage of the electromagnetic radiation formed by the fine aperture so as to have as little effect as possible on this radiation. If the line structure is designed as a strip line or micro strip line, then this strip line represents an asymmetric strip line in the described configuration.

An alternative design is that the radiation region of the line structure for guiding the high-frequency signal is implemented in the first electrically conductive inner layer, the fine aperture is implemented in the second electrically conductive inner layer, and that the first electrically conductive outer layer in the radiation region of the line structure for guiding the high-frequency signal implements a metallic shield. If, in this configuration, the line structure is implemented as a strip line, then it forms a symmetrical strip line in this arrangement.

As long as the radar arrangement has only a single antenna, which is then usually also fed with only a single high-frequency signal, the previously described variations of the underlying radar arrangement are largely unproblematic. However, if several adjacent antennas are to be implemented within the radar arrangement, which are then usually also fed with different—in particular phase-shifted—high-frequency signals, mutual interference between adjacent antennas and the adjacent transmission paths from the first electrically conductive outer layer to the second electrically conductive outer layer cannot be ruled out and is undesirable. This is where a preferred design of the radar arrangement comes into play, which is characterized in that a grid-like electromagnetic shielding is implemented by means of a plurality of electrical through-connections between the four electrically conductive layers, namely around the radiation region of the line structure for guiding the high-frequency signal, around the fine aperture for the defined passage of the electromagnetic radiation radiated by the radiation region of the line structure and around the antenna in the second electrically conductive outer layer and, if applicable, around the coarse aperture implemented in the second electrically conductive inner layer. The resulting structure of grid-like electromagnetic shielding, radiation region of the line structure, fine aperture and antenna in the second electrically conductive outer layer thus forms a unit cell. In the described design, it is easily possible that a plurality of unit cells are formed in the radar arrangement, wherein these unit cells can also be formed close to each other. The electrical through-connections between the four electrically conductive layers must be selected so closely that the electromagnetic waves transported in each unit cell cannot overcome the grid-like electromagnetic shielding.

In order to be able to achieve the highest possible density of unit cells, it is further preferably provided that the dimensions of the grid-like electromagnetic shielding and thus of the unit cell are selected at most so that several unit cells can be arranged on a preferably hexagonal grid with a spacing of half a wavelength to a whole wavelength of the high-frequency signal to be radiated. Thereby, it can be provided that the grid-like electromagnetic shielding of neighboring unit cells at least partially overlaps, i.e. two neighboring unit cells share a single section of the grid-like electromagnetic shielding.

In connection with the implementation of the grid-like electromagnetic shielding, it is further advantageously provided that the grid-like electro-magnetic shielding and thus the unit cell has a circular or hexagonal cross-section, viewed in the direction of the surface normals of the electrically conductive layers.

BRIEF DESCRIPTION OF THE DRAWINGS

There are now various possibilities for designing and further developing the radar arrangement according to the invention. For this, reference is made to the following description of embodiments in connection with the drawings.

DETAILED DESCRIPTION

Figure 1:
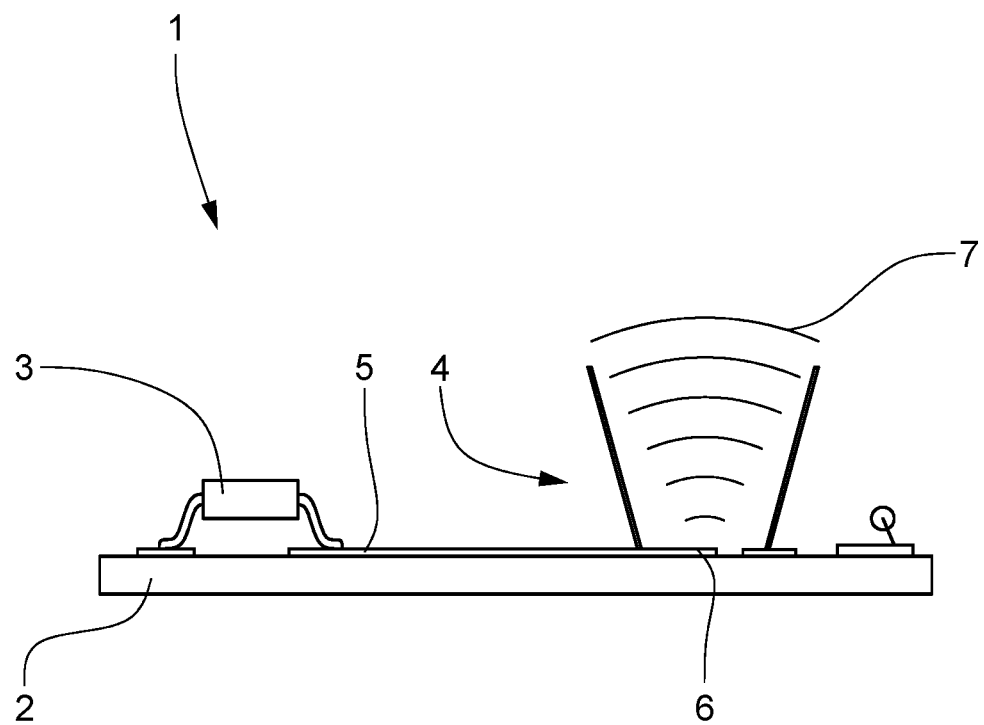
FIG. 1 illustrates an embodiment of a radar arrangement known from the prior art.

FIG. 1 shows a radar arrangement 1 as known from the prior art. The radar arrangement 1 has a printed circuit board 2 and an electronic component 3 and an antenna 4. The electronic component 3 is arranged on the printed circuit board 2 and is used to generate a high-frequency signal. The radar arrangement 1 further has a line structure 5, which is part of the printed circuit board 2, for guiding the high-frequency signal from the electronic component 3 into the region of the antenna 4, wherein the line structure 5 radiates the high-frequency signal at an open-ended radiation region 6 and impinges the antenna 4 with the radiated high-frequency signal.

In the schematic representation according to FIG. 1, the antenna 4 also comprises a horn for shaping and guiding the radiated electromagnetic waves 7, but this is not necessary for implementing an antenna 4. The embodiment according to FIG. 1 is also a schematic representation in that the dimensions of the components shown are not shown to scale. The representation is chosen in such a way that the components—this concerns, for example, the line structure 5—are recognizable as such. In any case, it is important to note that, in the illustrated embodiment, the component side of the printed circuit board 2, on which the electronic component 3 is thus located, is identical to the side on which the antenna 4 is implemented.

It is obvious that very simple designs for the illustrated radar arrangement 1 can be implemented in this way, but disadvantages arise here with regard to a desired process separation, also compact designs with several antennas can only be implemented to a limited extent.

In FIGS. 2 to 9, various aspects of a radar arrangement 1 are shown with which various disadvantages of the implementation according to FIG. 1 can be avoided.

Figure 2:
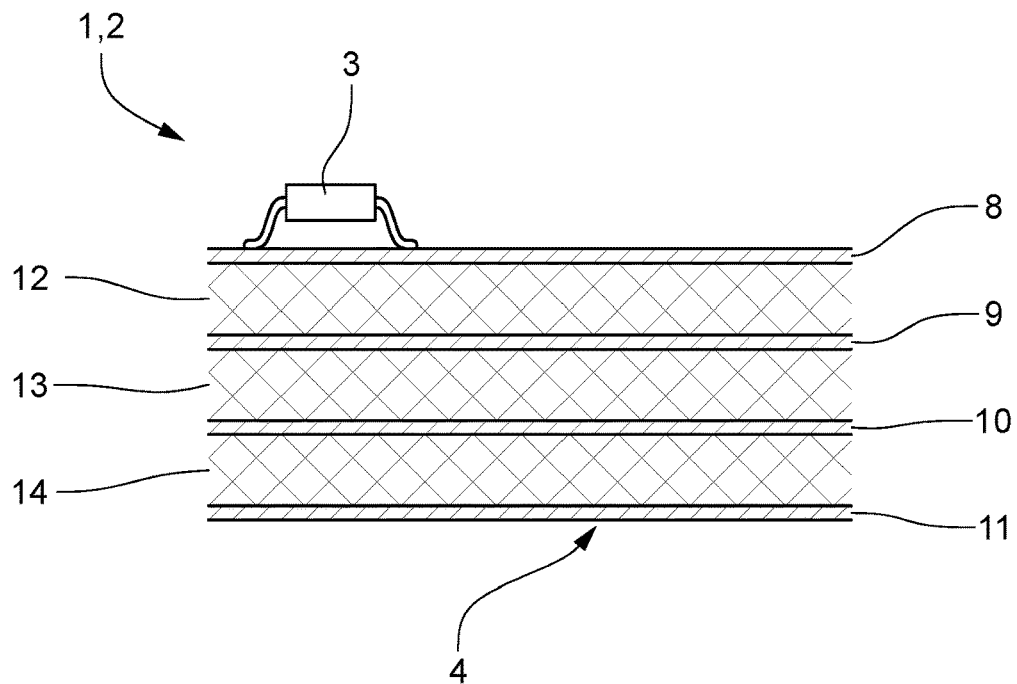
FIG. 2 illustrates an embodiment of a printed circuit board for a radar arrangement according to the invention.

Based on the embodiment according to FIG. 2, it is clear that the printed circuit board 2 comprises four electrically conductive layers 8, 9, 10, 11 extending substantially parallel to each other and separated from each other by at least three electrically insulating layers 12, 13, 14. When it is said that the various layers run "essentially" parallel to one another, this means that parallelism is not meant here in the mathematically exact sense, but to the extent that parallelism can be implemented in a technically meaningful sense—with the usual technically unavoidable inaccuracies.

Two outer layers of the printed circuit board 8, 11, the first electrically conductive outer layer 8 and the second electrically conductive outer layer 11, are formed by two electrically conductive layers 8, 11 of the at least four electrically conductive layers 8, 9, 10, 11, and the remaining at least two electrically conductive layers 9, 10 form electrically conductive inner layers 9, 10 of the printed circuit board 2. The first electrically conductive inner layer 9 is adjacent to the first electrically conductive outer layer 8 and the second electrically conductive inner layer 10 is adjacent to the second electrically conductive outer layer 11. The three electrically insulating layers 12, 13, 14 are all electrically insulating inner layers 12, 13, 14 of the printed circuit board 2.

The electronic component 3 is arranged on the first outer layer 8 of the printed circuit board 2, i.e. the component side, and the antenna 4 is formed in the second outer layer 11 of the printed circuit board, i.e. the antenna side. Thus, the high-frequency signal generated by the electronic component 3 is transmitted to the antenna formed in the second outer layer 11 of the printed circuit board 2 through the region of the electrically conductive and electrically insulating inner layers 9, 10, 12, 13, 14 of the printed circuit board 2. The illustration in FIG. 2 is very schematic. As will become apparent later, on the basis of indicated layer thicknesses, the electronic component 3 had to be shown considerably larger, namely approximately in the order of magnitude of the total layer thickness of the printed circuit board 2 shown here.

The illustration in FIG. 2 is also schematic in that it does not explicitly show how the antenna 4 is formed in the second electrically conductive outer layer 11 and how the electrically conductive inner layers 9,10 of the printed circuit board 2 are structured so that the high-frequency signal generated by the electronic component 3 can pass from the first electrically conductive outer layer 8 to that in the second electrically conductive outer layer 11 or to the antenna 4 formed therein. Of course, this would not be possible if the electrically conductive inner layers 9,10 had no interruptions. This also applies to the illustrations in FIGS. 3 to 4; here, too, the cuts have not been made in the areas where the interruptions required in the electrically conductive inner layers 9, 10 are implemented. It is important in FIGS. 2 to 4 that the structure of the printed circuit board 2 is clear.

In the illustrated embodiments of the radar arrangement 1 in FIGS. 2 to 9, the electrically insulating layers 12, 13, 14 have a thickness of about 100 μm and are made of a high-frequency substrate having a low attenuation for electromagnetic waves at frequencies of the high-frequency signal generated by the electronic component 3.

The electrically conductive layers 8, 9, 10, 11 in the embodiment according to FIG. 2 have a uniform thickness of about 18 μm, thus also the electrically conductive outer layers 8, 11.

Figure 3:
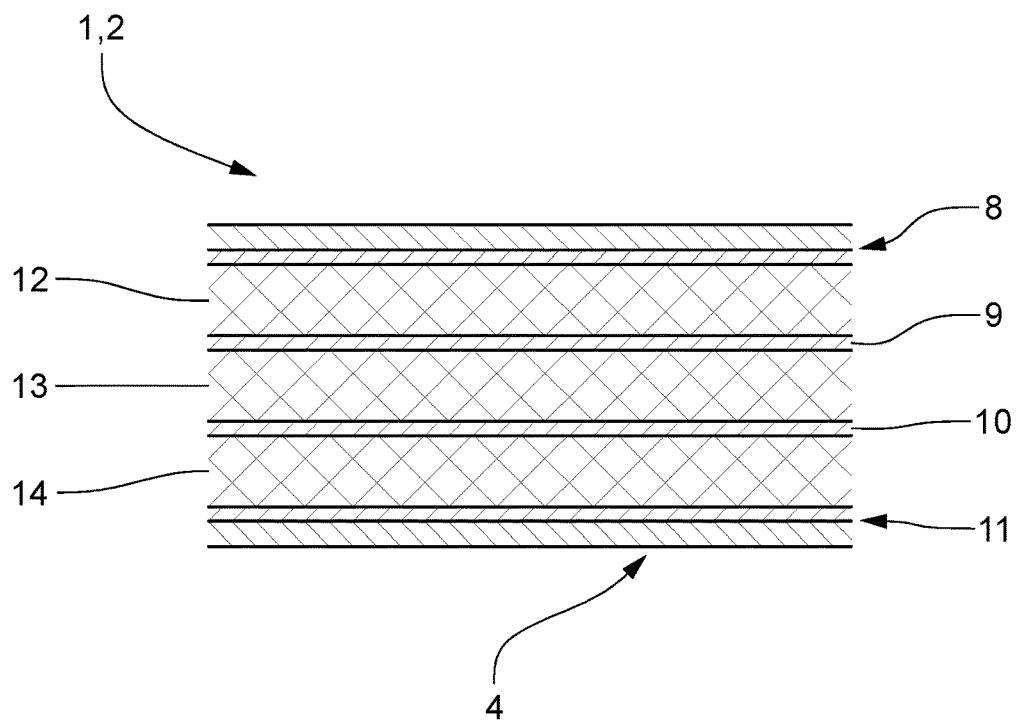
FIG. 3 illustrates an embodiment of a printed circuit board for a radar arrangement according to the invention with thicker conductive outer layers.

In contrast, the electrically conductive outer layers 8, 11 in the embodiment according to FIG. 3 have a layer thickness of about 43 μm, they are also formed from copper. The greater layer thickness of the electrically conductive outer layers 8, 11 has been achieved by electroplating copper onto an initially existing conductive copper layer with the thickness of the electrically conductive inner layers 9, 10 until the said layer thickness of the electrically conductive outer layers 8, 11 has been achieved. The ratios of the layer thicknesses of the various electrically conductive layers 8, 9, 10, 11 and the electrically insulating layers 12, 13, 14 are shown approximately correctly in FIGS. 2 to 5.

Figure 4:
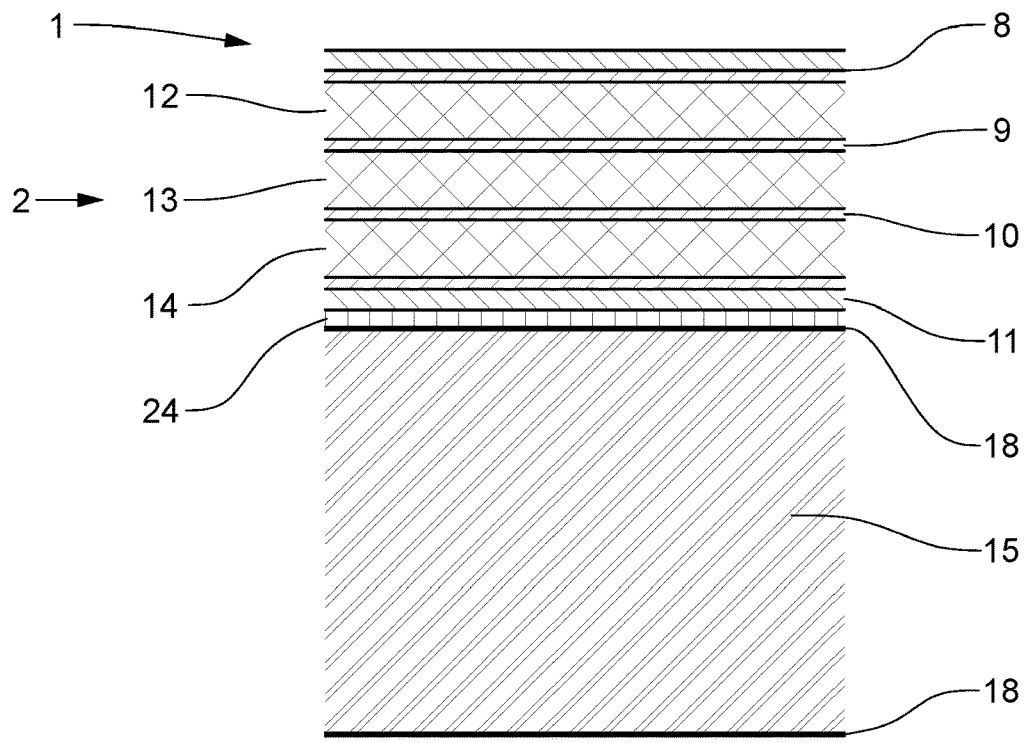
FIG. 4 illustrates an embodiment of a printed circuit board for a radar arrangement according to the invention with a stiffening layer.
Figure 5:
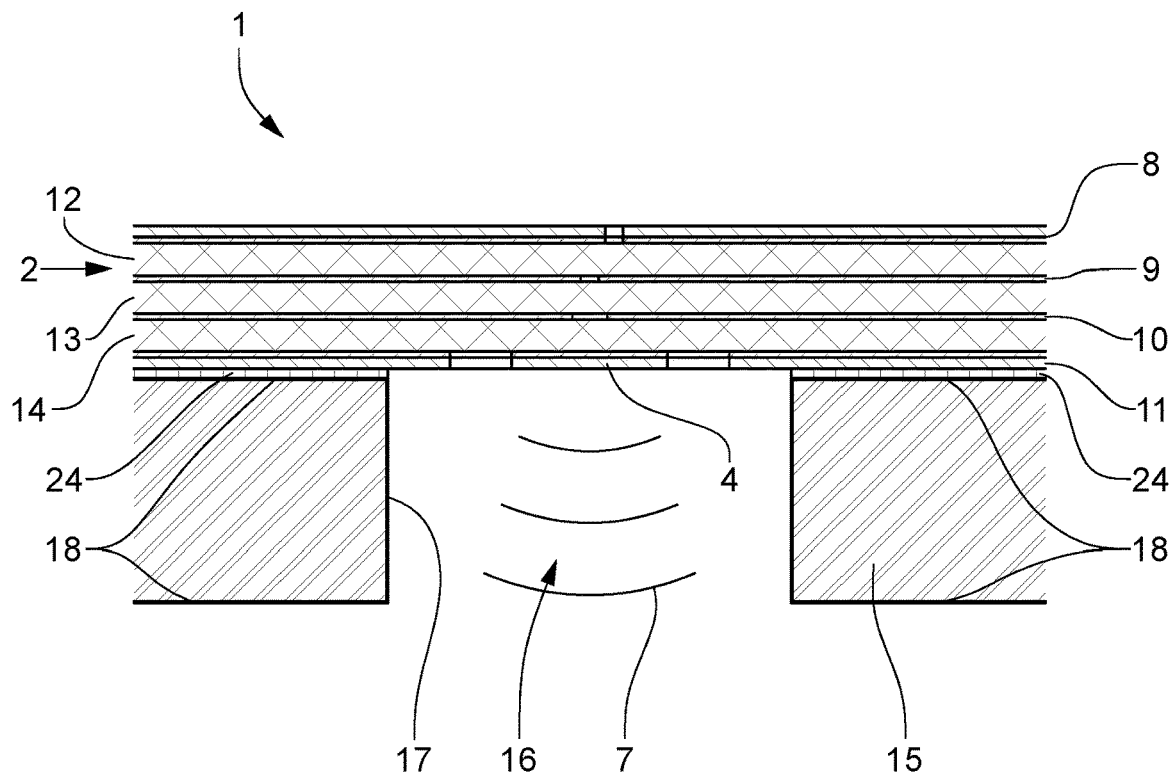
FIG. 5 illustrates an embodiment of a radar arrangement according to the invention with a recess in the stiffening layer.

In the embodiments of the radar arrangement 1 according to FIGS. 4 and 5, a stiffening layer 15 is fixed to the second electrically conductive outer layer 11, wherein the stiffening layer 15 is bonded to the second electrically conductive outer layer 11 by means of a bonding layer 24. The bonding layer 24 here has a thickness of about 30 μm. The stiffening layer 15 consists of a metallized non-metal, the non-metal being a composite material, in this case a composite material of glass fiber fabric and epoxy resin, namely FR-4. The stiffening layer 15 is provided on both sides with a metallization 18. Here, the stiffening layer 15 has a thickness of 0.7 mm. Since the bonding layer 24 is electrically conductive in the present case, the second electrically conductive outer layer 11, the bonding layer 24 and the metallization 18 form an electrically conductive unit. Even if the bonding layer 24 is not electrically conductive, the capacitor then formed from the second electrically conductive outer layer 11, the electrically insulating bonding layer 24 and the metallization 18 forms a short circuit, electrically speaking, during operation due to the high frequencies of the electromagnetic radiation that is common in the radar range.

In FIG. 5, a recess 16 is formed in the stiffening layer 15 in the region of the antenna 4 formed in the second conductive outer layer 11, thereby forming a boundary edge 17. The boundary edge 17 of the recess 15 is provided with a metallization 18 and is therefore metallized. The metallized boundary edge 17 thus influences the directivity of the radar arrangement 1.

In FIG. 5, how the antenna 4 is implemented in the second electrically conductive outer layer 11 is also shown for the first time, namely by providing the second electrically conductive outer layer 11 with corresponding interruptions, whereby the antenna 4 is exposed in the second electrically conductive outer layer 11.

In FIGS. 6 and 7, two different embodiments with specific geometries are shown, indicating how radar arrangements 1 can be advantageously implemented. Only the electrically conductive layers 8, 9, 10, 11 are shown in each case, wherein the first electrically conductive outer layer 8, the first electrically conductive inner layer 9, the second electrically conductive inner layer 10 and the second electrically conductive outer layer 11 are shown from top to bottom. The configurations according to FIGS. 6 and 7 have in common that the radiation region 6 of the line structure 5 for guiding the high-frequency signal, a fine aperture 19 for the defined passage of the electromagnetic radiation 7 radiated by the radiation region 6 of the line structure 5, and the antenna 4 in the second electrically conductive outer layer 11 are implemented in three of the electrically conductive layers 8, 9, 10, 11 as seen in the direction of the surface normals of the electrically conductive layers 8, 9, 10, 11 from the first electrically conductive outer layer 8 to the second electrically conductive outer layer 11. Thus, the embodiments in FIGS. 6 and 7 each implement an aperture-coupled patch antenna.

Figure 6A:
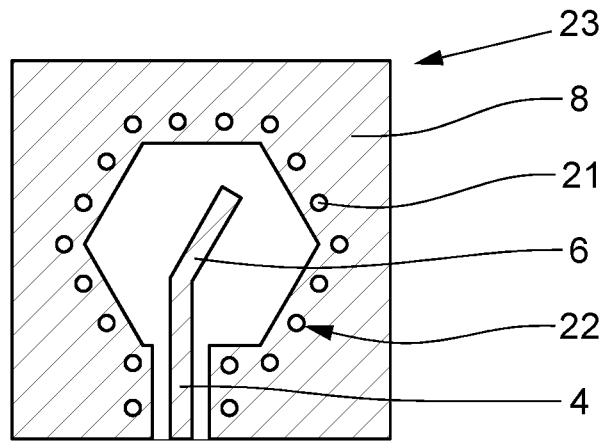
FIGS. 6a-6d illustrate different electrically conductive layers for implementing a radar arrangement according to the invention with asymmetrical strip line.
Figure 6B:
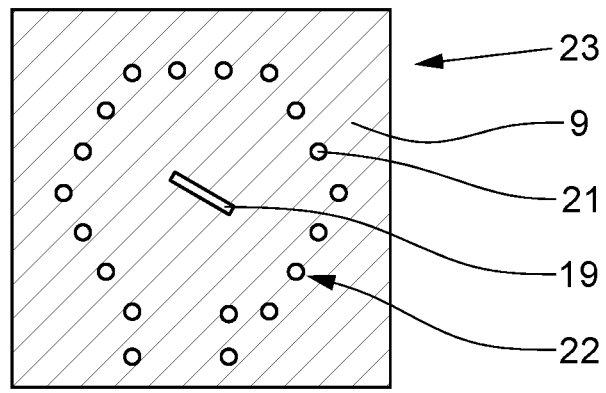
Figure 6C:
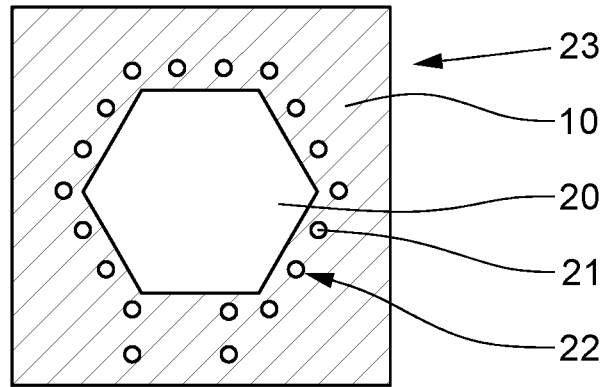
Figure 6D:
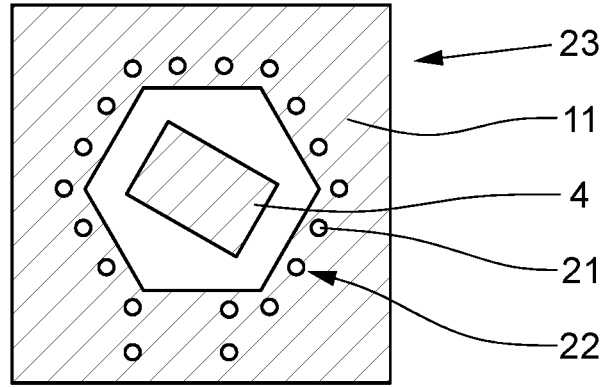
Figure 7A:
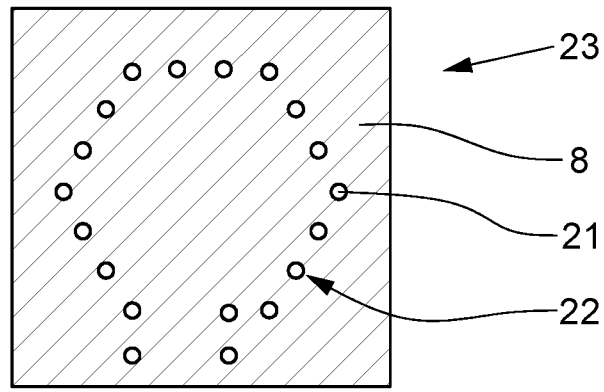
FIGS. 7a-7d illustrate different electrically conductive layers for realizing a radar arrangement according to the invention with symmetrical strip line.
Figure 7B:
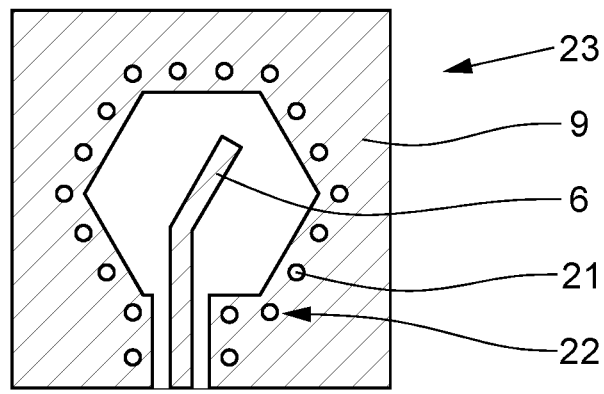
Figure 7C:
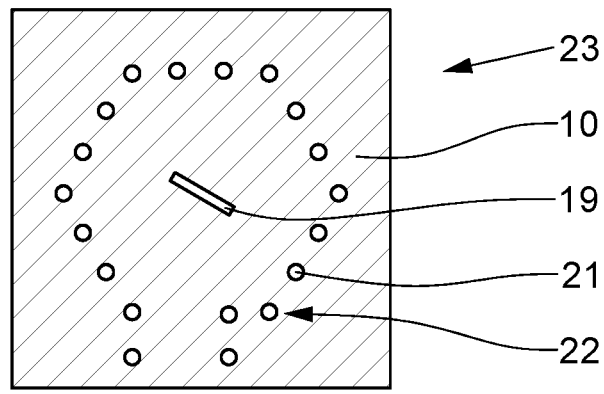
Figure 7D:
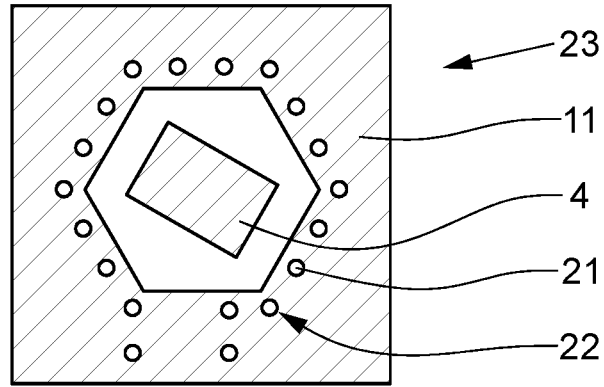

In the embodiment according to FIG. 6, the radiation region 6 of the line structure 5 for guiding the high-frequency signal is implemented in the first electrically conductive outer layer 8 (FIG. 6a), the fine aperture 19 is implemented in the first electrically conductive inner layer 9 (FIG. 6b), and a coarse aperture 20 is implemented in the second electrically conductive inner layer 10 (FIG. 6c). The coarse aperture 20 is larger than the fine aperture 19 and is used for the unobstructed passage of the electromagnetic radiation 7 passing through the fine aperture 19 to the antenna 4 formed in the second electrically conductive outer layer 11 (FIG. 6d).

Figure 8:
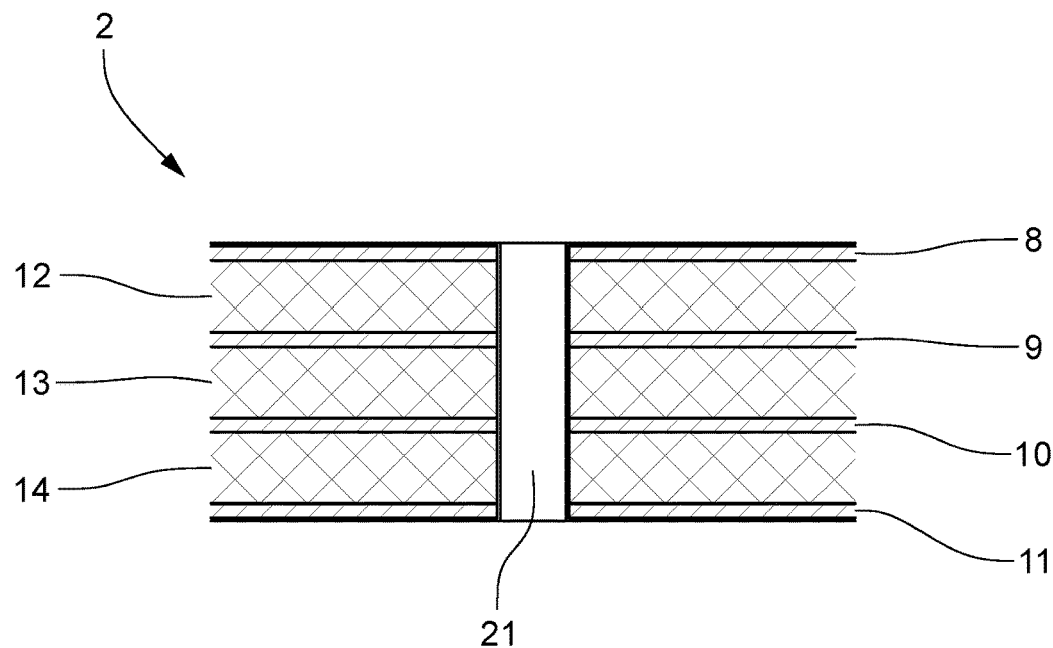
FIG. 8 illustrates an embodiment of a printed circuit board for a radar arrangement according to the invention with electrical through-connections between all four electrically conductive layers.

In the embodiment according to FIG. 7, on the other hand, the radiation region 6 of the line structure 5 for guiding the high-frequency signal is implemented in the first electrically conductive inner layer 9 and the fine aperture 19 is implemented in the second electrically conductive inner layer 10. The first electrically conductive outer layer 8 is formed as a metallic shield in the radiation region 6 of the line structure 5 for guiding the high-frequency signal. Since the line structure 5 is designed here as a strip line, the configuration according to FIG. 7 implements a symmetrical strip line due to the shielding on both sides by the first electrically conductive outer layer 8 and the second electrically conductive inner layer 10 with the exception of the fine aperture 19, FIG. 8 shows a special feature of the radar arrangements according to FIGS. 6, 7 and 9, namely an electrical through-connection 21 between the four electrically conductive layers 8, 9, 10, 11, which of course also extends through the three electrically insulating layers 12, 13, 14. The through-connection electrically connects all electrically conductive layers 8, 9, 10, 11. The electrical through-connection 21 here is a hole with a metallized inner wall. Such through-connections 21 are implemented in a plurality in the embodiments according to FIGS. 6, 7 and 9.

By means of this plurality of electrical through-connections 21 between the four electrically conductive layers 8, 9,

10, 11, a grid-like electromagnetic shielding 22 is implemented, namely around the radiation region 6 of the line structure 5 for guiding the high-frequency signal, around the fine aperture 19 for defined passage of the electromagnetic radiation 7 radiated by the radiation region 6 of the line structure 5 and around the antenna 4 in the second electrically conductive outer layer 11 and, as far as applicable (embodiment according to FIG. 6), around the coarse aperture 20 implemented in the second electrically conductive inner layer 10, so that the resulting structure of grid-like electromagnetic shielding 22, radiation region 6 of the line structure 5, fine aperture 19 and antenna 4 in the second electrically conductive outer layer 11 forms a unit cell 23.

Accordingly, in FIGS. 6 and 7, the structure of a grid-like electromagnetic shielding 22 and also of a unit cell 23 is also shown in each case in layers. The grid-like electromagnetic shielding 22 and thus the unit cell 23 have a hexagonal cross-section as viewed in the direction of the surface normals of the electrically conductive layers 8, 9, 10, 11.

Figure 9:
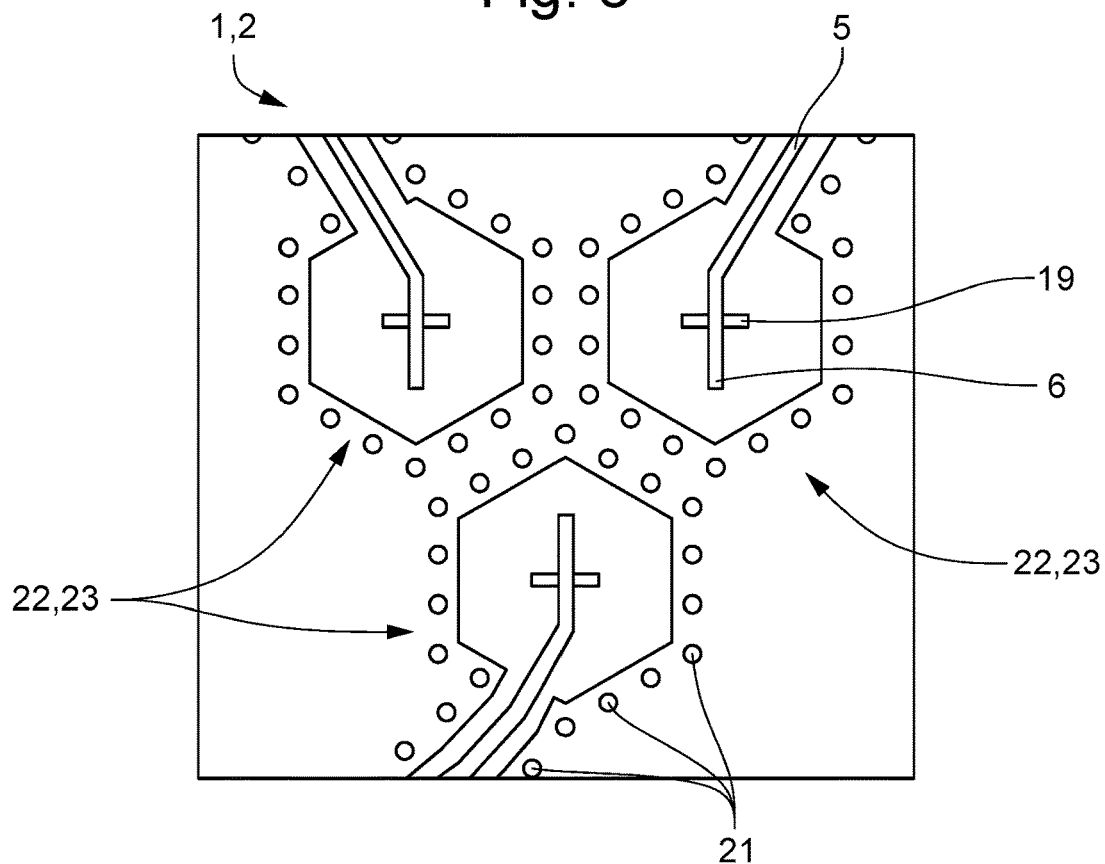
FIG. 9 illustrates an embodiment for a radar arrangement according to the invention with several unit cells.

Finally, FIG. 9 shows the implementation of several unit cells 23 within a radar arrangement 1 and thus the implementation of a patch antenna array with which—provided that the various unit cells are appropriately controlled—the directivity of the radar arrangement 1 can also be varied. The point of view here is from above on the first electrically conductive outer layer, in which the line structure 5 with its radiation region 6 is implemented. The fine aperture 19 in the underlying first electrically conductive inner layer is still indicated. The dimensions of the grid-like electromagnetic shielding 22 and thus of the unit cell 23 are selected in such a way that several unit cells 23 can be arranged on a hexagonal grid with a spacing of a whole wavelength of the radiated high-frequency signal.

The invention claimed is:

1. A radar arrangement, comprising:
a printed circuit board;
at least one electronic component; and
at least one antenna;
wherein the electronic component is arranged on the printed circuit board and is used at least to generate a high-frequency signal;
at least one line structure, being part of the printed circuit board, for guiding the high-frequency signal from the electronic component into the region of the antenna;
wherein the line structure radiates the high-frequency signal at an open-ended radiation region and impinges the antenna with the radiated high-frequency signal;
wherein the printed circuit board has at least four electrically conductive layers which run essentially parallel to one another and are separated from one another by at least three electrically insulating layers, so that the first outer layer and the second outer layer are formed by at least two electrically conductive layers of the at least four electrically conductive layers, and the remaining at least two electrically conductive layers form electrically conductive inner layers of the printed circuit board;
wherein the first electrically conductive inner layer is adjacent to the first electrically conductive outer layer and the second electrically conductive inner layer is adjacent to the second electrically conductive outer layer, and the at least three electrically insulating layers all form electrically insulating inner layers of the printed circuit board;
wherein the electronic component is arranged on the first electrically conductive outer layer of the printed circuit board;
wherein the antenna is formed at least partially in the second outer layer of the printed circuit board;
wherein the high-frequency signal generated by the electronic component is transmitted to the antenna, which is formed at least partially in the second electrically conductive outer layer of the printed circuit board, through the region of the electrically conductive inner layers and electrically insulating inner layers of the printed circuit board; and
wherein the at least four electrically conductive layers include an electrically conductive layer that forms the radiation region of the line structure for guiding the high-frequency signal, and an electrically conductive layer that includes a fine aperture for defined passage of the electromagnetic radiation radiated by the radiation region of the line structure, and wherein the electrically conductive layer that includes the fine aperture is between the second electrically conductive outer layer and the electrically conductive layer that forms the radiation region of the line structure.

2. The radar arrangement according to claim 1, wherein the electrically insulating layers have a thickness of between 50 μm and 200 μm.

3. The radar arrangement according to claim 1, wherein the electrically insulating layers include a high-frequency substrate having a low attenuation for electromagnetic waves at frequencies of the high-frequency signal.

4. The radar arrangement according to claim 1, wherein the electrically conductive inner layers have a layer thickness of 10 μm to 30 μm; and
wherein the electrically conductive inner layers are formed of copper.

5. The radar arrangement according to claim 1, wherein the electrically conductive outer layers have a layer thickness of 15 μm to 60 μm; and
wherein the electrically conductive outer layers are formed from copper.

6. The radar arrangement according to claim 1, wherein the stiffening layer is laminated or bonded to the second electrically conductive outer layer; and
wherein the stiffening layer includes at least one of a metallized non-metal and a metal.

7. The radar arrangement according to claim 6, wherein the stiffening layer has a thickness of 0.5 mm to 0.9 mm.

8. The radar arrangement according to claim 6, wherein a recess is formed in the stiffening layer in the region of the antenna formed at least partially in the second conductive outer layer; and
wherein the boundary edge of the recess is metallized.

9. The radar arrangement according to claim 1, wherein the electrically conductive layer that includes the radiation region of the line structure is the first electrically conductive outer layer, the electrically conductive layer that includes the fine aperture is the first electrically conductive inner layer, and the second electrically conductive inner layer includes a course aperture; and
wherein the coarse aperture is larger than the fine aperture and is used for the unhindered passage of the electromagnetic radiation passing through the fine aperture to the antenna formed at least partially in the second electrically conductive outer layer.

10. The radar arrangement according to claim 1, wherein the electrically conductive layer that includes the radiation region of the line structure is the first electrically conductive inner layer, and the electrically conductive layer that includes the fine aperture is the second electrically conductive inner layer; and wherein the first electrically conductive outer layer is formed as a metallic shield.

11. The radar arrangement according to claim 1, wherein the line structure for guiding the high-frequency signal is designed as a strip line.

12. The radar arrangement according to claim 6, wherein the stiffening layer includes a metallized non-metal; and
wherein the metallized non-metal is a composite material including glass fiber fabric and epoxy resin.

13. A radar arrangement, comprising:
a printed circuit board;
at least one electronic component; and
at least one antenna;
wherein the electronic component is arranged on the printed circuit board and is used at least to generate a high-frequency signal, having at least one line structure, being part of the printed circuit board, for guiding the high-frequency signal from the electronic component into the region of the antenna;
wherein the line structure radiates the high-frequency signal at an open-ended radiation region and impinges the antenna with the radiated high-frequency signal;
wherein the printed circuit board has at least four electrically conductive layers which run essentially parallel to one another and are separated from one another by at least three electrically insulating layers, so that the first outer layer and the second outer layer are formed by at least two electrically conductive layers of the at least four electrically conductive layers, and the remaining at least two electrically conductive layers form electrically conductive inner layers of the printed circuit board;
wherein the first electrically conductive inner layer is adjacent to the first electrically conductive outer layer and the second electrically conductive inner layer is adjacent to the second electrically conductive outer layer, and the at least three electrically insulating layers all form electrically insulating inner layers of the printed circuit board;
wherein the electronic component is arranged on the first electrically conductive outer layer of the printed circuit board;
wherein the antenna is formed at least partially in the second outer layer of the printed circuit board;
wherein the high-frequency signal generated by the electronic component is transmitted to the antenna, which is formed at least partially in the second electrically conductive outer layer of the printed circuit board, through the region of the electrically conductive inner layers and electrically insulating inner layers of the printed circuit board; and
wherein by means of a plurality of electrical through-connections between the four electrically conductive layers, a grid-like electromagnetic shielding is implemented around the radiation region of the line structure for guiding the high-frequency signal, around a fine aperture for the defined passage of the electromagnetic radiation radiated by the radiation region of the line structure and around the antenna in the second electrically conductive outer layer and around a coarse aperture implemented in the second electrically conductive inner layer, so that the resulting structure of grid-like electromagnetic shielding, the radiation region of the line structure, the fine aperture, and the antenna in the second electrically conductive outer layer form a unit cell.

14. The radar arrangement according to claim 13, wherein the electrically insulating layers have a thickness of between 50 μm and 200 μm.

15. The radar arrangement according to claim 13, wherein the electrically insulating layers include a high-frequency substrate having a low attenuation for electromagnetic waves at frequencies of the high-frequency signal.

16. The radar arrangement according to claim 13, wherein the electrically conductive inner layers have a layer thickness of 10 μm to 30 μm; and
wherein the electrically conductive inner layers are formed of copper.

17. The radar arrangement according to claim 13, wherein the electrically conductive outer layers have a layer thickness of 15 μm to 60 μm; and
wherein the electrically conductive outer layers are formed from copper.

18. The radar arrangement according to claim 13, wherein the stiffening layer is laminated or bonded to the second electrically conductive outer layer; and
wherein the stiffening layer includes at least one of a metallized non-metal and a metal.

19. The radar arrangement according to claim 18, wherein the stiffening layer includes a metallized non-metal; and
wherein the metallized non-metal is a composite material including glass fiber fabric and epoxy resin.

20. The radar arrangement according to claim 13, wherein the stiffening layer has a thickness of 0.5 mm to 0.9 mm.

21. The radar arrangement according to claim 13, wherein a recess is formed in the stiffening layer in the region of the antenna formed at least partially in the second conductive outer layer; and
wherein the boundary edge of the recess is metallized.

22. The radar arrangement according to claim 13, wherein the line structure for guiding the high-frequency signal is designed as a strip line.

23. The radar arrangement according to claim 13, wherein the grid-like electromagnetic shield and thus the unit cell has a circular or hexagonal cross-section as seen in a direction normal to respective surfaces of the at least four electrically conductive layers.

24. The radar arrangement according to claim 13, wherein the dimensions of the grid-like electromagnetic shielding and thus of the unit cell are chosen maximally such that several unit cells can be arranged on a hexagonal grid with a spacing of half a wavelength to a whole wavelength of the radiated high-frequency signal.

* * * * *